United States Patent [19]
Lin

[11] Patent Number: 6,155,861
[45] Date of Patent: Dec. 5, 2000

[54] SOCKET CONNECTOR

[75] Inventor: Nick Lin, Hsin-Chuang, Taiwan

[73] Assignee: Hon Hai Precision Ind. Co., Ltd., Taipei Hsien, Taiwan

[21] Appl. No.: 09/295,809

[22] Filed: Apr. 20, 1999

[51] Int. Cl.[7] .................................................. H01R 4/50
[52] U.S. Cl. ............................................................ 439/342
[58] Field of Search .................................... 439/342, 259, 439/263, 264, 268

[56] References Cited

U.S. PATENT DOCUMENTS

| 4,420,205 | 12/1983 | Kirkman . | |
|---|---|---|---|
| 5,730,615 | 3/1998 | Lai et al. | 439/342 |
| 5,791,928 | 8/1998 | Lai | 439/342 |

*Primary Examiner*—Khiem Nguyen
*Attorney, Agent, or Firm*—Wei Te Chung

[57] ABSTRACT

A socket connector includes a rectangular base defining an array of slots arranged in rows and columns parallel to edges thereof. The slots receive and retain contact elements therein. A rectangular cover is movably supported on the base and defines holes therein corresponding to the slots for receiving pins of a central processing unit (CPU). The base has lugs formed on two diagonal corners thereof each forming a wall substantially normal to the diagonal direction. The cover forms a straight edge at a corner corresponding to each lug of the base. A triangular notch is formed in each wall having a first side inclined with respect to the diagonal direction and a second side substantially parallel to the diagonal direction. The notch is capable of receiving a screwdriver therein and allows the screwdriver to rotate. The rotation of the screwdriver causes an edge thereof to partially project beyond the wall and drivingly engages with the corresponding straight edge of the cover for moving the cover with respect to the base thereby driving the pins of the CPU to engage with the contact elements.

18 Claims, 5 Drawing Sheets

SOCKET CONNECTOR

BACKGROUND OF THE INVENTION

1. Field of the Invention

The present invention generally relates to a socket connector, and in particular to a mobile socket connector which can be readily closed or opened.

2. The Prior Art

A mobile socket connector comprises a base mounted to a circuit board and a cover slidably positioned on the base. The base defines a plurality of slots therein arranged in an array having rows and columns for receiving and retaining contacts electrically connected to the circuit board. The cover defines a plurality of holes corresponding to the slots of the base and is adapted to retain an external device, such as a central processing unit (CPU). The CPU is positioned on a top face of the cover with pins thereof extending through the holes and partially into the slots of the base. The slots are elongate for allowing the pins to move therein whereby when the cover is moved with respect to the base, the pins of the CPU are brought into engagement with the contacts thereby forming an electrical connection between the CPU and the circuit board.

Conventionally, a camming mechanism operated by a lever is required to displace the cover with respect to the base. Such a mechanism occupies a significant amount of space and thus is not suitable for use with a notebook computer. Low profile socket connectors disclosed in co-pending U.S. patent application Ser. Nos. 09/146,998 assigned to the assignee of the present application, eliminate the camming mechanism thereby reducing the space occupied by the connector. The lower profile socket connectors use a tool, such as a screwdriver, supported by a structure to facilitate movement of the cover. However, the structure of the conventional socket connector is complicated. It is thus desirable to have a socket connector comprising a simplified and effective tool supporting structure.

SUMMARY OF THE INVENTION

Accordingly, an object of the present invention is to provide a socket connector having a simple and effective structure for supporting an external tool when displacing a cover with respect to a base.

To achieve the above object, an electrical connector in accordance with the present invention comprises a rectangular base defining an array of slots arranged in rows and columns parallel to edges thereof. The slots receive and retain contact elements therein. A rectangular cover is movably supported on the base and defines holes therein corresponding to the slots for receiving pins of a CPU. The base has lugs formed on two diagonal corners thereof each forming a wall substantially normal to the diagonal direction. The cover forms a straight edge at a corner corresponding to each lug of the base. A triangular notch is formed in each wall and has a first side inclined with respect to the diagonal direction and a second side substantially parallel to the diagonal direction. The notch can receive a screwdriver therein and allows the screwdriver to rotate. The rotation of the screwdriver causes an edge thereof to partially project beyond the wall and drivingly engage with the corresponding straight edge of the cover for moving the cover with respect to the base thereby driving the pins of the CPU to engage with the contact elements.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
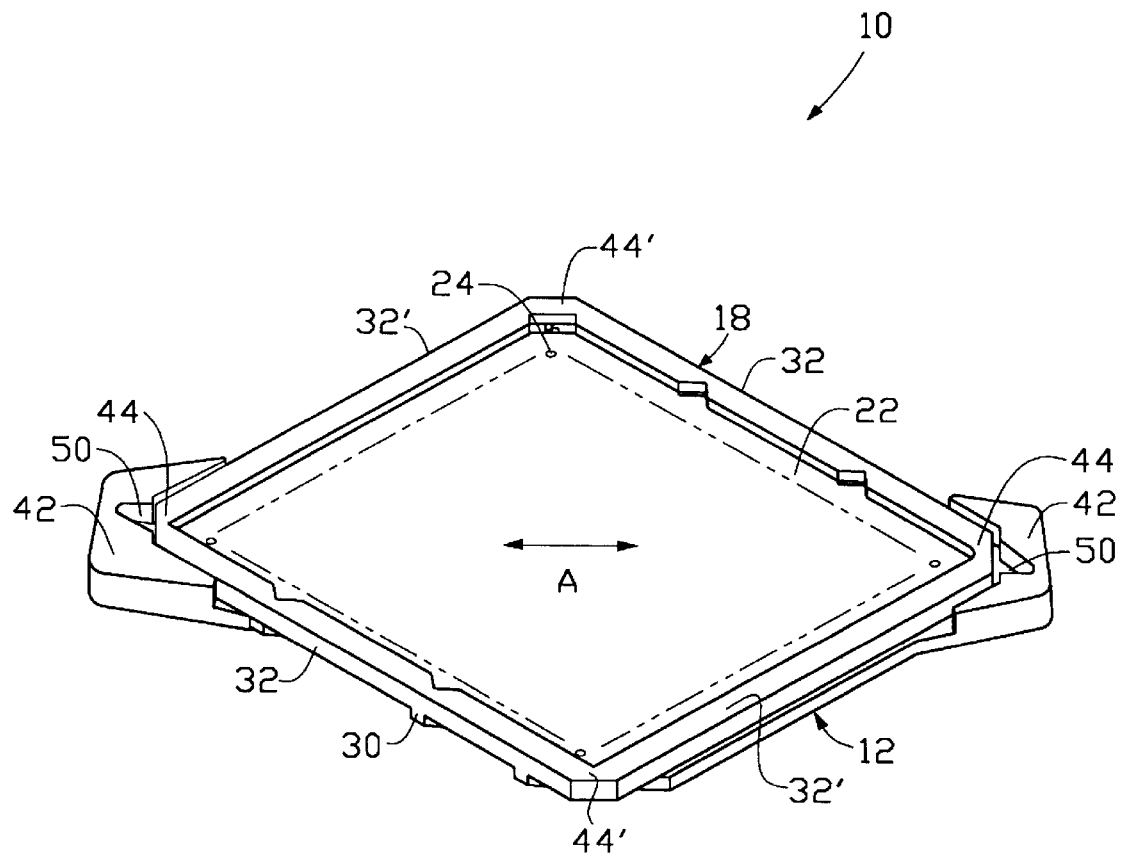
FIG. 1 is a perspective view of a socket connector in accordance with the present invention.
Figure 2:
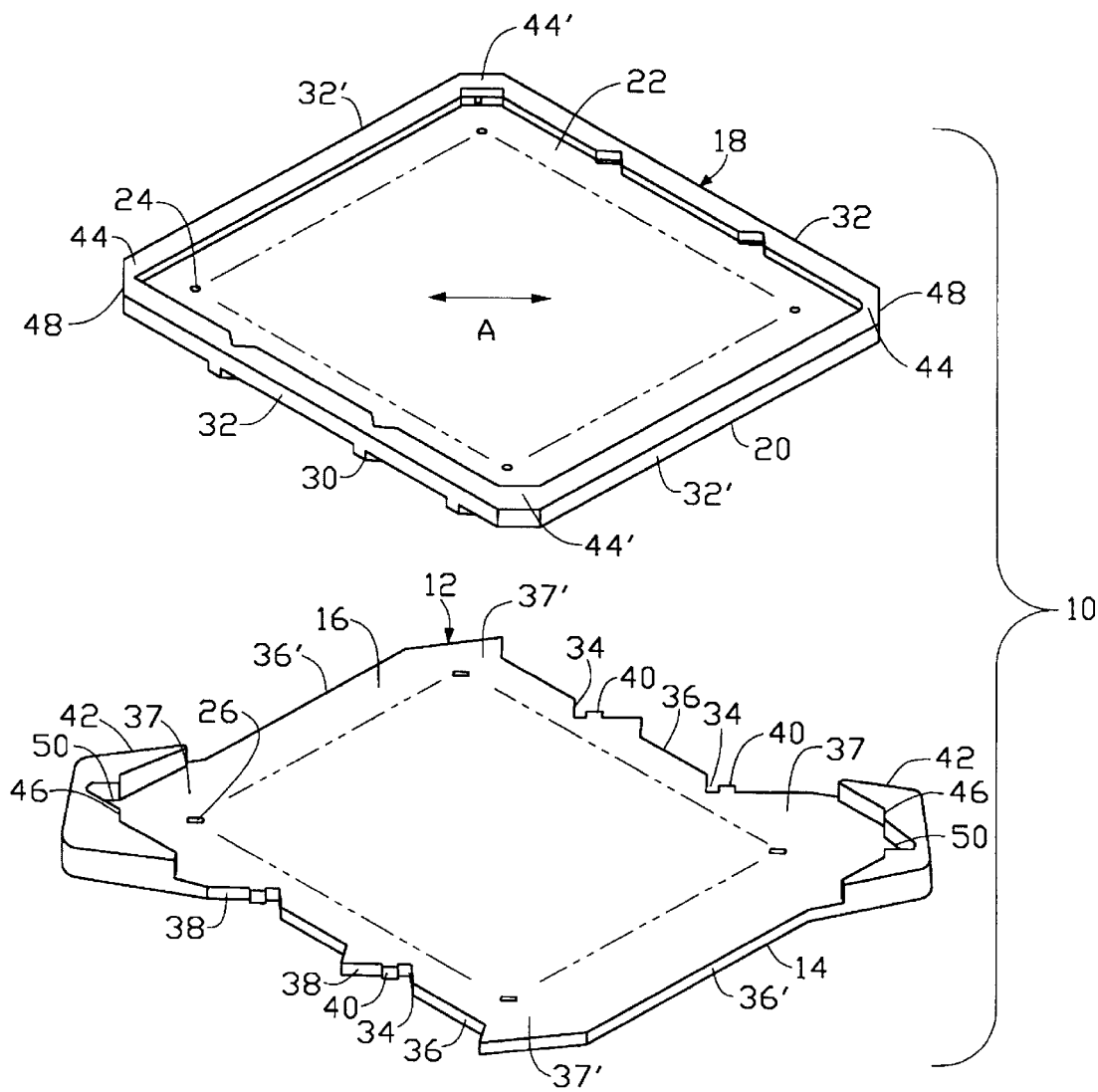
FIG. 2 is an exploded view of the socket connector.

Referring to the drawings and in particular to FIGS. 1 and 2, a socket connector in accordance with the present invention, generally designated by reference numeral 10, comprises a flat base 12 having a bottom face 14 adapted to be positioned on a circuit board (not shown) and a top face 16 on which a flat, movable cover 18 is supported. The cover 18 has a bottom face 20 positioned on the top face 16 of the base 12 and a top face 22 adapted to retain an external device, such as a central processing unit (not shown), thereon and drive the external device to move therewith. Both the base 12 and the cover 18 are made of insulative material.

The cover 18 defines a plurality of through holes 24 between the top and bottom faces 22, 20 thereof for receiving pins of the external device. The pins of the external device extend through the holes 24 and project beyond the bottom face 20 of the cover 18. The holes 24 are arranged in an array having rows and columns. The holes 24 form a diagonal direction indicated by arrows A which is not parallel to either the rows or columns thereof. Preferably, the cover 18 is rectangular and has four edges 32, 32' and corners 44, 44' whereby the rows and columns of holes 24 are parallel to the edges 32,32'.

The base 12 defines a plurality of slots 26 corresponding to the holes 24 of the cover 18. The base 12 is rectangular and has four edges 36, 36' and corners 37, 37'. The pins of the external device partially extend into the slots 26 and are movable with respect thereto. Each slot 26 receives and retains a contact element (not shown) therein which is engageable with the corresponding pin of the external device when the cover 18 is moved in the diagonal direction A. To accommodate the movement of the pins of the external device, the slots 26 are elongate in the diagonal direction A. A solder ball 28 (FIG. 3) is attached to each of the contact elements on the bottom face 14 of the base 12 for electrically engaging with the circuit board by means of ball grid array (BGA) techniques.

Figure 3:
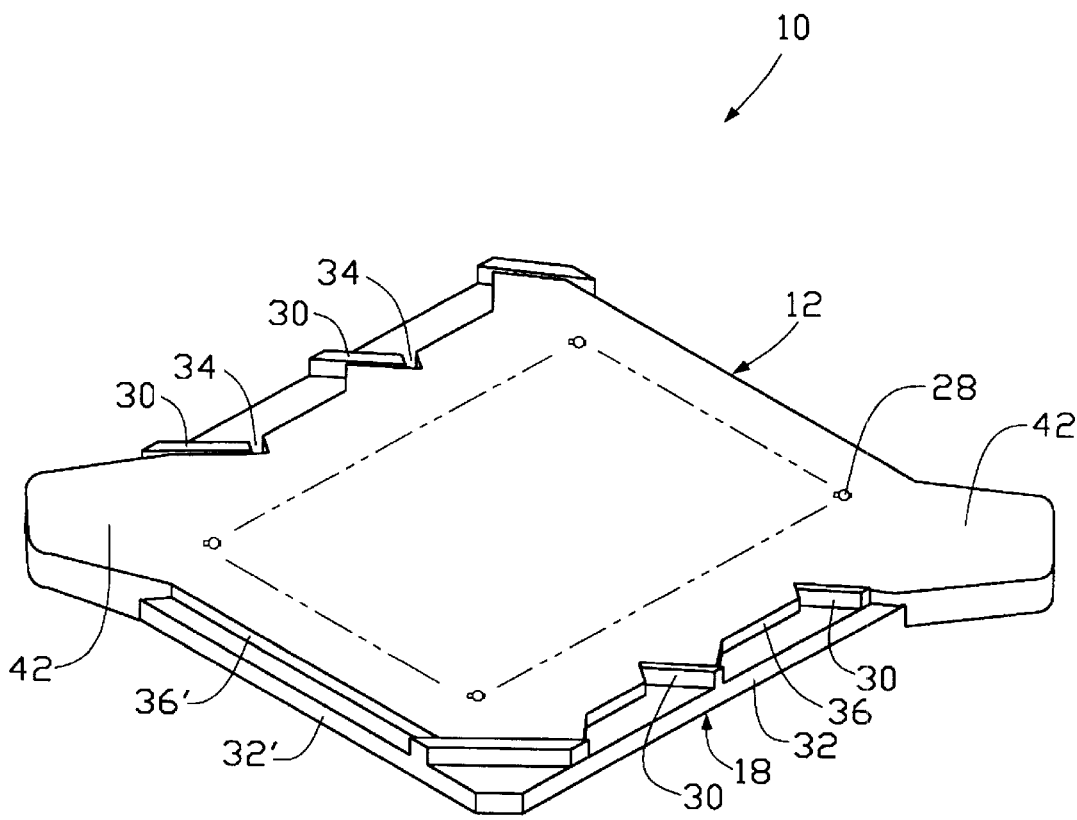
FIG. 3 is a perspective view of the socket connector taken from a bottom side thereof.
Figure 4:
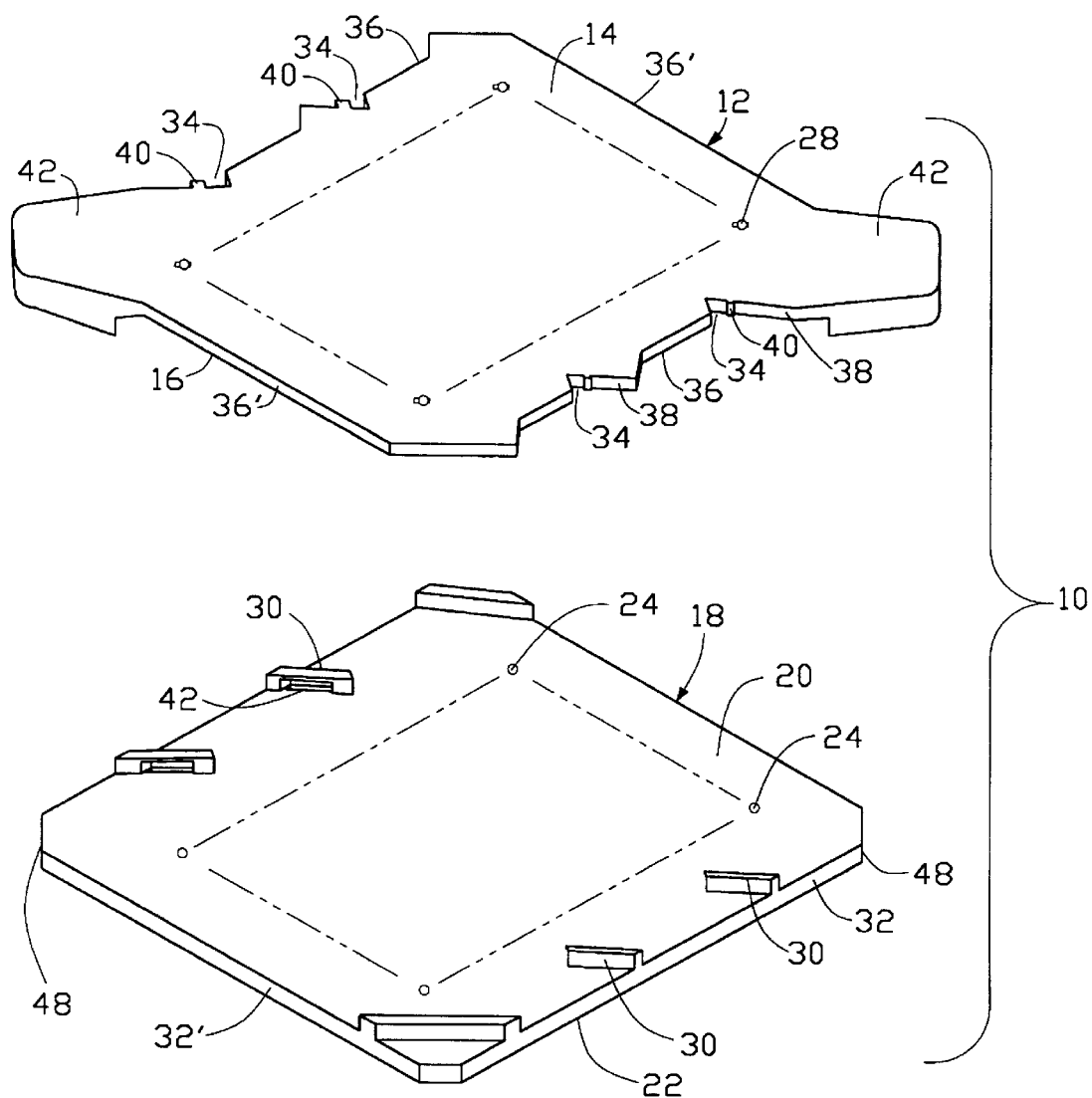
FIG. 4 is an exploded view of FIG. 3.
Figure 5:
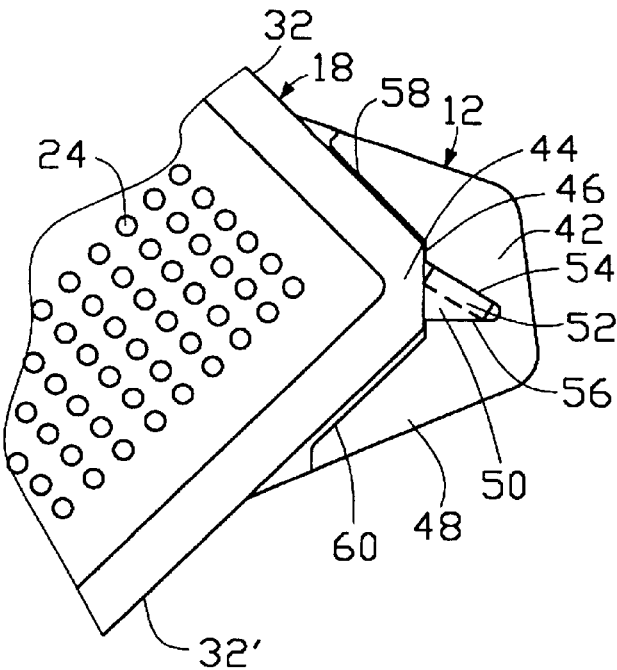
FIG. 5 is an enlarged view of a lug of a base of the socket connector showing a cover which is not displaced by an external tool.

Referring to FIGS. 3 and 4, to guide the movement of the cover 18 with respect to the base 12, the cover 18 forms a plurality of ribs 30 on the bottom face 20 thereof extending in the diagonal direction. The ribs 30 are spaced along opposite edges 32 of the cover 20. The base 12 defines a plurality of notches 34 in opposite edges 36 thereof. Each notch 34 has an inclined side wall 38 extending in the diagonal direction A and slidably engaging with the corresponding rib 30 of the cover 18 thereby guiding the cover 18 to move in the diagonal direction with respect to the base 12. Preferably, the side wall 38 extends beyond the edge 36 for facilitating and guiding the movement of the cover 18.

Therefore, the cover 18 is movable with respect to the base 12 in a direction that is not parallel to the Tows and columns of holes 24. The diagonal movement of the cover 18 with respect to the base 12 allows the force driving the cover 18 to be distributed to more pins of the external device thereby reducing potential damage to the pins.

A projection 40 is formed on the inclined side wall 38 of each notch 34 for being movably received in a slit 42 defined in the corresponding rib 30 of the cover 18 thereby preventing the cover 18 from separating from the base 12.

Further referring to FIGS. 1, 2, 5 and 6, the base 12 forms two opposite lugs 43 at the diagonal corners 37 thereof. The lugs 43 extend from the corners 37 in the diagonal direction A corresponding to the diagonal corners 44 of the cover 18 with the cover 18 located therebetween. Each lug 43 forms a stop wall 46. The diagonal corner 44 forms a straight edge 48 connecting between adjacent edges 32, 32' of the cover 18 and confronting the wall 46. When the cover 18 is moved with respect to the base 12, the straight edge 48 is moved relative to the stop wall 46 and may selectively contact the stop walls 46 for stopping the movement of the cover 18. Preferably, the stop wall 46 and the straight edges 48 are substantially normal to the diagonal direction A.

Figure 6:
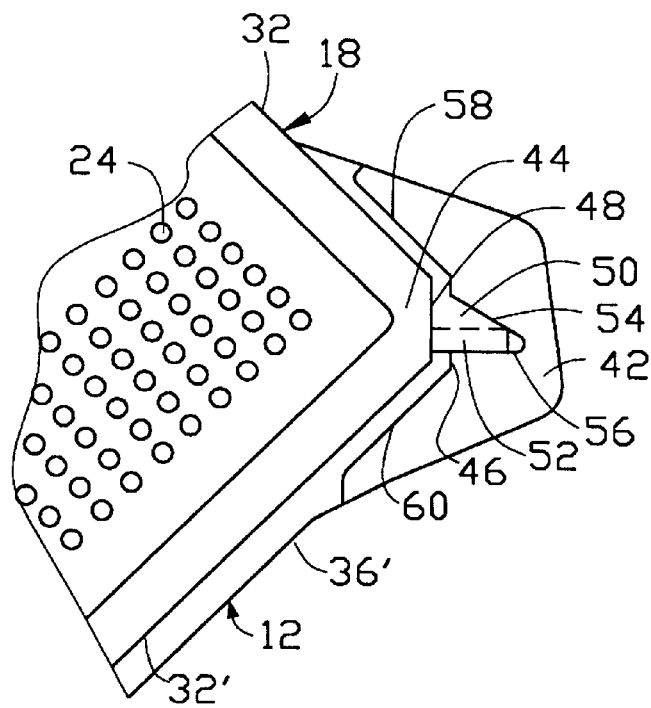
FIG. 6 is an enlarged view of the lug showing the cover displaced by an external tool.

A notch 50 is defined in each stop wall 46 and sized to receive a portion of an external tool , such as a flat head screwdriver 52, therein. The screwdriver 52 is rotatable in the notch 50 whereby an edge thereof projects beyond the wall 46 and drivingly engages with the cover 18 to move the cover 18 from a position where the straight edge 48 substantially engages with the stop wall 46 (FIG. 5) to a position where straight edge 48 is distanced from the stop wall 46 (FIG. 6). The arrangement of two such stop walls 46 on opposite sides of the cover 18 allows a user to selectively move the cover 18 with respect to the base 12 with the aid of the screwdriver 52 for closing and opening the socket connector. Preferably, the notch 50 is located in a middle portion of the stop wall 46 for preventing excessive stress from being concentrated on opposite ends of the straight edge 48 of the cover 18.

The notch 50 has a first inside face 54 and a second inside face 56 connected to each other and forming a triangle with the straight edge 48. The second inside face 56 is substantially parallel to the diagonal direction while the first inside face 54 is inclined with respect thereto. The inclination of the first inside face 54 provides a distance between the connection of the faces 54, 56 and the straight edge 48 sufficient to accommodate the screwdriver 52 therein when the straight edge 48 engages with the wall 46. The connection between the faces 54, 56 forms a support for the rotation of the screwdriver 52 whereby when the screwdriver 52 is rotated from the first inside face 54 (FIG. 5) to the second inside face 56 (FIG. 6), the screwdriver 52 increasingly projects beyond the stop wall 46 and drives the cover 18 away from the stop wall 46.

Preferably, two side extension walls 58, 60 extend from the stop wall 46 corresponding to the edges 32, 32' of the corner 44 of the cover 18 for engaging with the edges 32, 32' when the straight edge 48 of the corner 44 is moved toward the stop wall 46.

Alternatively, the movement of the cover 18 with respect to the base 12 may be limited by a preset length of the slits 42 which movably receive the projections 40 of the side walls 38.

It is noted that the notches 50 are located on two diagonal corners of the base 12 in a reverse manner for actuating the cover 18 to move with regard to the base 12 along the diagonal direction defined by such two diagonal corners, and each notch is defined of a triangle including a first inside face 54 and a second inside face 56 wherein the second inside face 56 is substantially parallel to the diagonal direction. This arrangement facilitates efficient actuation and force-saving performance.

Although the present invention has been described with reference to the preferred embodiment, it is apparent to those skilled in the art that a variety of modifications and changes may be made without departing from the scope of the present invention which is intended to be defined by the appended claims.

What is claimed is:

1. An electrical connector comprising:
a base having a top face, a bottom face and two first diagonal corners forming a diagonal direction, a plurality of slots being defined in the base between the top and bottom faces thereof for receiving and retaining contact elements therein; a cover having a bottom face movably supported on the top face of the base for moving in the diagonal direction between a first position and a second position and a top face adapted to retain an external electronic device having pins, the cover having two second diagonal corners formed in the diagonal direction and abutting against the first diagonal corners, respectively, in response to a movement of the cover with respect to the base between the first position and the second position, a plurality of holes being defined in the cover between the top and bottom faces corresponding to the slots of the base for receiving the pins of the external electronic device, the pins projecting beyond the bottom face thereof and partially received in the slots whereby when the cover is moved from the first position to the second position with respect to the base, the pins are brought by the cover to engage with the contact elements; and
means for driving the cover with respect to the base in the diagonal direction;
wherein the driving means comprises a straight edge formed on each second diagonal corner of the cover and a corresponding wall formed on each first diagonal corner of the base, a notch being defined in the wall adapted to accommodate an external tool, the notch being configured to allow rotation of the external tool therein with an edge of the tool increasingly projecting beyond the wall and engaging with the straight edge for driving the cover to move.

2. The electrical connector as claimed in claim 1, wherein the cover forms a plurality of ribs extending in the diagonal direction and slidably received in notches defined in the base, each notch being defined by a side wall extending in the diagonal direction and slidably engaging with the corresponding ribs of the cover for guiding the movement of the cover in the diagonal direction.

3. The electrical connector as claimed in claim 2, wherein the side wall of the notch comprises a projection movably received in a slit defined in the corresponding rib of the cover.

4. The electrical connector as claimed in claim 3, wherein the slit has a preset length which limits movement of the cover with respect to the base.

5. The electrical connector as claimed in claim 1, wherein each second diagonal corner of the cover forms a straight edge, and wherein each first diagonal corner of the base forms a stop wall selectively engageable with the straight edge of the cover for stopping movement of the cover with respect to the base in the diagonal direction.

6. The electrical connector as claimed in claim 1, wherein the straight edge is substantially normal to the diagonal direction.

7. The electrical connector as claimed in claim 1, wherein both the cover and the base are rectangular and correspond in size, and wherein a lug is formed on each first diagonal corner of the base extending in the diagonal direction, the walls being formed on the lugs.

8. An electrical connector comprising a cover supported on a base and movable with respect thereto in a predetermined direction, the cover having a top face adapted to retain an electronic device having pins, holes being formed in the cover for receiving the pins of the electronic device, the base defining a plurality of slots for retaining contact elements therein, the slots being elongate to accommodate the movement of the cover with respect to the base whereby the movement of the cover brings the pins of the electronic device into engagement with the corresponding contact elements, the improvements comprising two opposite lugs extending from the base in the predetermined direction, each lug forming a wall confronting a corresponding edge of the cover, a notch being defined in the wall and adapted to accommodate an external tool therein, the notch being configured to allow rotation of the tool, an edge of the tool projecting therebeyond and engaging with the corresponding edge of the cover for moving the cover with respect to the base;

wherein the cover comprises a flat rectangular body having two diagonal corners each formed by two edges of the cover, each diagonal corner forming a chamfered edge connecting between the two edges and wherein the base comprises a rectangular body having two diagonal corners from which the lugs extend, the predetermined direction being between the diagonal corners, the walls of the lugs confronting the chamfered edges of the cover.

9. The electrical connector as claimed in claim 8, wherein the notch has a first inside face extending at an incline relative to the predetermined direction.

10. The electrical connector as claimed in claim 9, wherein the notch of the wall has a second inside face connected to the first inside face thereby forming a triangle.

11. The electrical connector as claimed in claim 8, wherein the wall of each lug comprises two extended side walls corresponding to the two edges of the cover.

12. The electrical connector as claimed in claim 11, wherein the notch is formed in a middle portion of the wall between the extended side walls thereof.

13. The electrical connector as claimed in claim 8, wherein the slots of the base are elongate in the diagonal direction.

14. An electrical connector comprising:

a rectangular base having four edges and corners, an array of slots being defined in the base and arranged in rows and columns parallel to the edges thereof for each receiving a contact element therein, the slots being elongated in a diagonal direction between two diagonal corners, an extension being formed on each of the two diagonal corners with a wall formed thereon substantially normal to the diagonal direction; and a rectangular cover having four edges and corners, the cover being positioned on the base and movable with respect thereto in the diagonal direction, a chamfer being formed at each of two diagonal corners for forming a face confronting the wall of a corresponding extension of the base, the face being movable with respect to the wall between a proximate position and a remote position, a plurality of through holes being defined in the cover corresponding to the slots of the base;

wherein a notch is formed in the wall of each extension of the base, the notch having a first inside face inclined with respect to the diagonal direction and adapted to receive an external tool, the notch being configured to allow rotation of the tool therein whereby the rotation of the tool causes an edge of the tool to project along the diagonal direction beyond the notch and drivingly engage with the face of the cover thereby moving the cover with respect to the base from the proximate position to the remote position.

15. The electrical connector as claimed in claim 14, wherein the notch has a second inside face connected to the first inside face thereby forming a triangle, and said second inside face is substantially parallel to the diagonal direction.

16. The electrical connector as claimed in claim 14, wherein the wall comprises two side segments extending therefrom and substantially parallel to the edges of the cover for engaging with the edges of the cover.

17. The electrical connector as claimed in claim 14, wherein the notch is formed in a middle portion of the wall.

18. An electrical connector comprising:

a base including a plurality of slots extending therethrough in a vertical direction and two first diagonal corners;

a cover moveably attached to the base including a plurality of holes extending therethrough in the vertical direction and two second diagonal corners respectively facing to said two first diagonal corners; and a pair of notches respectively formed in the corresponding first diagonal corners of the base, wherein each of said notches includes a first inclined inside face and a second inside face cooperatively adapted to allow an external tool to horizontally rotate therebetween, and said second inside face is substantially parallel to a diagonal direction defined by said two first diagonal corners so that by insertion and rotation of the external tool within one of said two notches, the cover can be moved with regard to the base in said diagonal direction.

\* \* \* \* \*